United States Patent
Van Est et al.

(10) Patent No.: US 11,335,844 B2
(45) Date of Patent: May 17, 2022

(54) PIEZOELECTRIC WASHER FOR ACCELEROMETER SENSOR WITH RESISTIVE PATH ON THE OUTER CONTOUR THEREOF

(71) Applicants: CONTINENTAL AUTOMOTIVE FRANCE, Toulouse (FR); CONTINENTAL AUTOMOTIVE GMBH, Hannover (DE)

(72) Inventors: Jéroen Van Est, Montgiscard (FR); Florian Chauprade, Le Vigen (FR); Manon Sartelet, Toulouse (FR)

(73) Assignee: VITESCO TECHNOLOGIES GMBH, Hanover (DE)

( * ) Notice: Subject to any disclaimer, the term of this patent is extended or adjusted under 35 U.S.C. 154(b) by 112 days.

(21) Appl. No.: 16/767,003

(22) PCT Filed: Nov. 13, 2018

(86) PCT No.: PCT/FR2018/052818
§ 371 (c)(1),
(2) Date: May 26, 2020

(87) PCT Pub. No.: WO2019/102104
PCT Pub. Date: May 31, 2019

(65) Prior Publication Data
US 2020/0395527 A1 Dec. 17, 2020

(30) Foreign Application Priority Data
Nov. 27, 2017 (FR) ...................................... 1761202

(51) Int. Cl.
*H01L 41/04* (2006.01)
*G01P 15/08* (2006.01)
(Continued)

(52) U.S. Cl.
CPC .......... *H01L 41/04* (2013.01); *G01P 15/0802* (2013.01); *G01P 15/09* (2013.01); *H01L 41/1132* (2013.01)

(58) Field of Classification Search
CPC ...... G01P 15/09; G01P 15/0802; H01L 41/04; H01L 41/047; G01L 41/1132
See application file for complete search history.

(56) References Cited

U.S. PATENT DOCUMENTS 9,960,339 B2  5/2018 Naono
2002/0011111 A1  1/2002 Otsuchi et al.
(Continued)

FOREIGN PATENT DOCUMENTS

WO  2016/136252 A1  9/2016

OTHER PUBLICATIONS

International Search Report, dated Mar. 14, 2019, from corresponding PCT application No. PCT/FR2018/052818.

*Primary Examiner* — Helen C Kwok
(74) *Attorney, Agent, or Firm* — Nixon & Vanderhye

(57) ABSTRACT

Disclosed is a piezoelectric washer intended for an accelerometer sensor having a ceramic body and a conductive electrode on each of two opposing faces, an electrical resistance being to be established between the two conductive electrodes. The ceramic body has, on its outer contour, a resistive path connecting the conductive electrodes to one another with a predetermined length and cross-section of the resistive path according to the resistance to be established between the two conductive electrodes.

20 Claims, 2 Drawing Sheets

(51) Int. Cl.
*G01P 15/09* (2006.01)
*H01L 41/113* (2006.01)

(56) References Cited

U.S. PATENT DOCUMENTS

| | | | |
|---|---|---|---|
| 2003/0160544 A1* | 8/2003 | Riedel | F16K 31/006 |
| | | | 310/332 |
| 2012/0090409 A1* | 4/2012 | Luthje | G01P 3/48 |
| | | | 73/862.627 |
| 2012/0255358 A1 | 10/2012 | Imanaka | |
| 2014/0009034 A1* | 1/2014 | Gabi | H01L 41/273 |
| | | | 310/328 |
| 2017/0352796 A1 | 12/2017 | Naono | |

\* cited by examiner

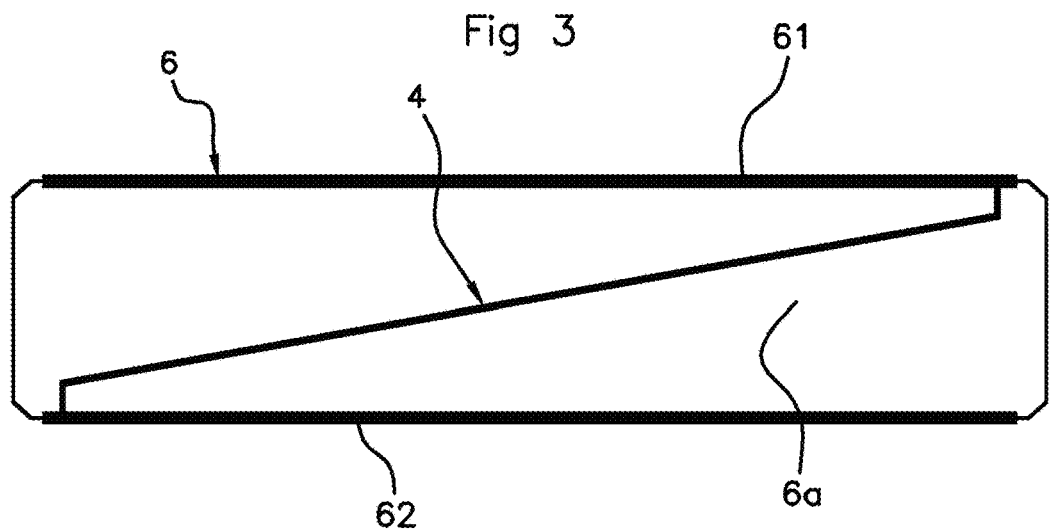
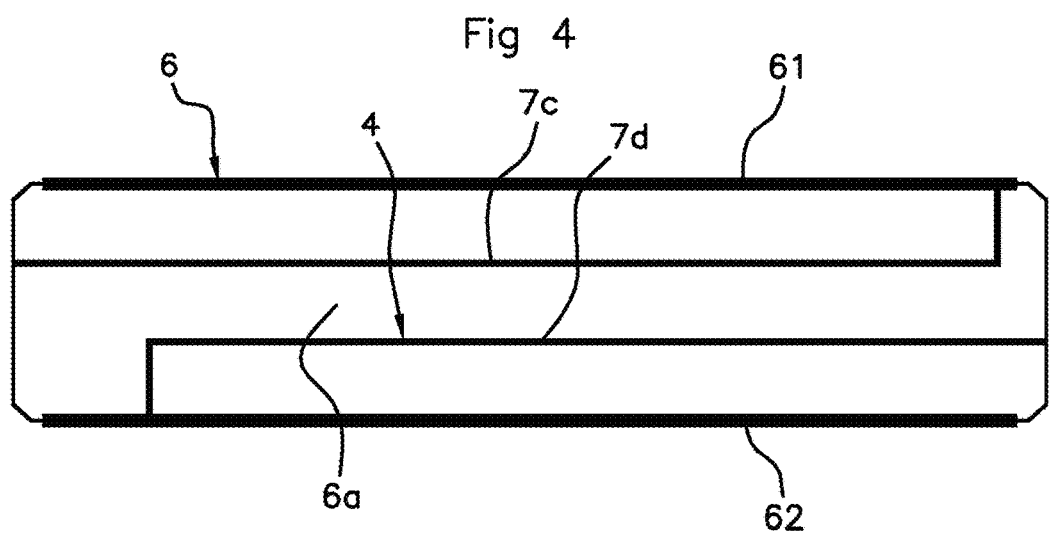
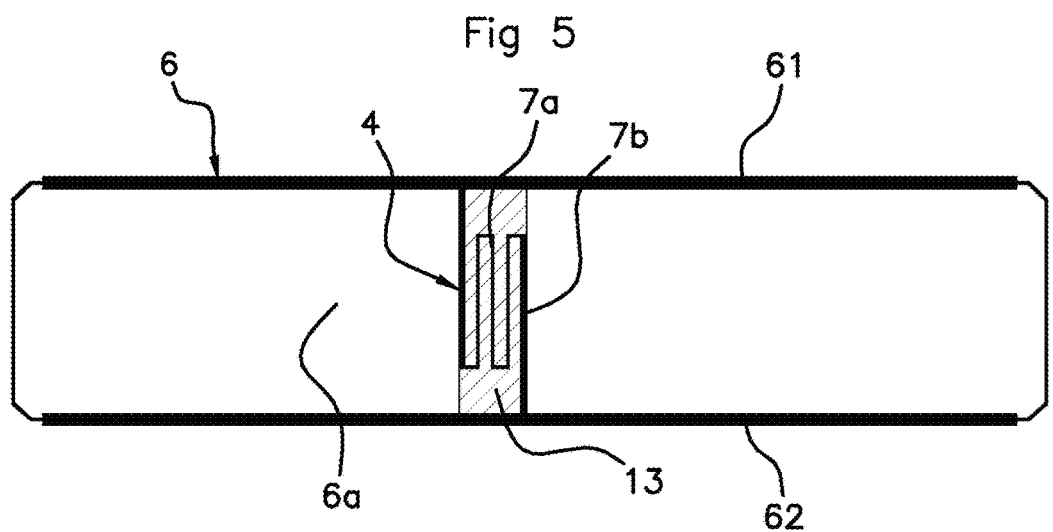

PIEZOELECTRIC WASHER FOR ACCELEROMETER SENSOR WITH RESISTIVE PATH ON THE OUTER CONTOUR THEREOF

BACKGROUND OF THE INVENTION

Field of the Invention

The present invention relates to a piezoelectric washer for an accelerometer sensor, in particular a knock sensor for a combustion engine of a motor vehicle.

Description of the Related Art

The sensor has a ceramic body and a conductive electrode on each of two opposite faces, an electrical resistance being to be established between the two conductive electrodes.

A piezoelectric washer has a metallized ceramic body so as to function as a piezoelectric material such that a voltage or a load applied to the washer results in a change in volume and a force exerted on the washer results in a change in the electric charge produced by the piezoelectric washer.

It is known that such an accelerometer sensor has an electrical resistor external to the accelerometer sensor. Such a resistor has metal attachment lugs that are bent and soldered to contact rings located on each of the faces of the piezoelectric washer, which are themselves metallized with a layer of silver and referred to as conductive electrodes.

Since the entire sensor and in particular its piezoelectric washer is overmolded in an overmolding material, when the accelerometer sensor experiences thermal variations, the attachment lugs of the resistor are subjected to shear stresses due to the differences in thermal expansion between the overmolding material and the metal attachment lugs. These stresses can lead to the resistor lugs breaking at the bends. The resistor is then no longer functional.

Strengthening the attachment lugs by changing their base material, for example by making them of nickel, has been envisaged. This increases their manufacturing cost and changes the electrical resistance and has therefore not proven to be satisfactory, especially since nickel lugs are problematic to solder to the piezoelectric washer.

In addition, when attaching the attachment lugs to the piezoelectric washer and subsequently mounting the piezoelectric washer in the accelerometer sensor, since the electrical resistor is external to the sensor and protrudes from the sensor, this resistor may be damaged and may no longer perform its function.

As a first problem underlying the present invention, it makes sense for an accelerometer sensor to be designed with the resistor being located between the conductive electrodes of a piezoelectric washer forming part of the sensor which is protected both during the manufacture of the sensor and during its use, mainly so that the resistor cannot be detached from the electrical circuit.

Another problem is due to the change in material programmed for a piezoelectric washer.

The most commonly used material for a piezoelectric washer until present was lead zirconate titanate, also known by the abbreviation PZT. This material had a relatively stable electrical resistance with respect to temperature but also the clear drawback of containing lead. However, the use of lead is becoming increasingly prohibited and many countries have already banned its use.

Replacing the PZT material containing lead with other materials which do not contain it, for example by replacing the lead with bismuth, has been envisaged. For example, without it being limiting, it is possible to use a niobate-based perovskite such as for example potassium-sodium niobate, also known by the abbreviation KNN, or else a ceramic material based on titanium-barium or BT.

These materials are more expensive, which discourages their use, but above all do not exhibit a relatively stable electrical resistance with respect to temperature or at least an electrical resistance which would be comparable to the electrical resistance of the PZT material. Other elements which have not been mentioned could be used but have not yet been due to an excessive dependence of their electrical resistance on temperature resulting in excessive variations in their electrical resistance due to thermal drift.

The second problem underlying the present invention is, for an accelerometer sensor which contains a ceramic material exhibiting an electrical resistance that varies greatly with operating temperature, at least to attenuate these variations in resistance with respect to temperature so that the acceleration values from the sensor are not distorted by these variations in resistance.

SUMMARY OF THE INVENTION

To this end, the present invention relates to a piezoelectric washer for an accelerometer sensor having a ceramic body and a conductive electrode on each of two opposite faces, an electrical resistance being to be established between the two conductive electrodes, noteworthy in that the ceramic body has, on its outer contour, a resistive path connecting the conductive electrodes to one another with a length and cross section of the resistive path predetermined according to the resistance to be established between the two conductive electrodes.

The technical effect is to incorporate the electrical resistor in the form of a resistive path on the outer contour of the ceramic body forming the piezoelectric washer. The resistor can no longer be accidentally detached from the piezoelectric washer as was possible with an external resistor attached by attachment lugs according to the state of the art. Additionally, there is no longer the need for elements for mounting the electrical resistor, namely the attachment lugs, advantageously made of nickel, and no longer the need to attach the attachment lugs to the piezoelectric washer, which simplifies the process of attaching the electrical resistor to the piezoelectric washer.

Possible thermal variations between the coating and the resistor are avoided because the method for attaching the resistive path takes place by adhesion of the resistive path to the ceramic body and no longer by mechanical attachment.

In addition, through the choice of a material for the resistive path, it is easily possible to obtain an electrical resistance which varies with temperature, which is in order to compensate for the possible variations in resistance of the piezoelectric washer made of a base material that has an electrical resistance which varies with temperature.

It is thus possible to replace a PZT material containing lead with another material which has the advantage of being cheaper than KNN or BT materials. As an alternative, KNN or BT materials may also be used with correction of their variation in electrical resistance with respect to temperature.

Alternatives to PZT materials may thus be proposed, even if these alternatives have an electrical resistance which varies with temperature. This responds to an increasingly pressing need no longer to use materials containing lead while ensuring a correction for possible variations in electrical resistance of the piezoelectric washer with respect to temperature.

The advantages of the present invention are to ensure the robustness and the function of the electrical resistance of the piezoelectric washer during thermal variations with change in the value of the electrical resistance of the washer in addition to the elimination of elements, namely the attachment lugs, and ensuring better protection of the electrical resistor.

Advantageously, the resistive path runs axially, tangentially or with tangential and axial components across the external contour of an edge of the ceramic body, the length l and cross section s of the resistive path being predetermined according to the resistance R to be established and the resistivity r of a material forming the resistive path according to the following formula:

$$R = \frac{r \times l}{s}$$

The piezoelectric washer is substantially cylindrical in shape with a median void. It is in relation to the median void that the terms axially, tangentially or with tangential and axial components are to be considered.

Several parameters for obtaining the predetermined resistance are thus possible. It is advantageous to modify the length of the resistive path rather than its thickness or its width. The longer the length, the more the resistance will increase. It is then possible to increase the thickness and the width accordingly to facilitate obtaining the resistive path and to work with less restrictive size conditions in terms of thickness and width of the resistive path.

Advantageously, the resistive path runs mainly in one or more planes parallel to the conductive electrodes while being connected at each of its ends to a respective conductive electrode. The resistive path then runs axially across the piezoelectric washer and may make one turn, more than one turn or only a portion of a turn over a portion of the outer contour of the edge of the piezoelectric washer. Since the circumference of the washer is larger than the width between the two conductive electrodes, it is easier to have a resistive path of long length in comparison with widthwise across the edge.

Advantageously, the resistive path runs mainly perpendicular to the conductive electrodes across a thickness of the piezoelectric washer while being connected at each of its ends to a respective conductive electrode. The work involved in forming the resistive path is facilitated compared to the previous embodiment since the portion of the outer contour is less curved in this case. The decreased length available for the resistive path may be increased by forming loops.

Advantageously, the resistive path has at least one return loop having a return branch toward a starting conductive electrode which does not reach the starting conductive electrode and a branch directed toward a destination conductive electrode, the branch directed toward the destination conductive electrode reaching the destination conductive electrode in the case of a single return loop.

The presence of one or more return loops may allow the length of the resistive path to be increased and the main drawback of a resistive path running axially, namely its decreased length, to be overcome. For example, a length of at least one branch of said at least one return loop may be greater than or equal to half a thickness of the edge of the ceramic body, which may more than double the length of the resistive path.

Advantageously, the resistive path has at least one return loop and a final loop that extends said at least one return loop, said final loop having a return branch toward a starting conductive electrode which does not reach the starting conductive electrode and a final branch which reaches the destination conducting electrode. The more return loops, the more it is possible to increase the length of the resistive path.

Advantageously, the resistive path is resistive ink deposited on the outer contour of the ceramic body. The resistivity of the ink is predetermined and the desired electrical resistance may then be precisely obtained by inking the resistive path. In addition, the ink may be selected to have a temperature-dependent resistivity, the resistive path then being able to correct a possible deviation in the electrical resistance of the piezoelectric washer due to its base material. Carbon-based ink may be used.

Advantageously, the resistive path is a path of resistive material resulting from a local melting of the ceramic body during etching or burning of the outer contour of the ceramic body.

What is burned is one or more chemical elements contained in the ceramic body of the piezoelectric washer. Carbon may be present among these elements but this is not exclusive. According to the composition of the base material and the temperature of the etch, a person skilled in the art may estimate the amount of material in the ceramic body that is burnt, the composition thereof and the resistivity thereof in order to obtain a resistive path corresponding to the desired resistance.

The invention relates to an accelerometer sensor noteworthy in that it comprises such a piezoelectric washer. This accelerometer sensor may be a knock sensor associated with a combustion engine of a motor vehicle.

Lastly, the invention relates to a method for obtaining a resistive path connecting the opposite conductive electrodes of such a piezoelectric washer or of a piezoelectric washer present in such an accelerometer sensor, with a length and cross section of the resistive path predetermined according to the resistance to be established between the two conductive electrodes of the piezoelectric washer, noteworthy in that the resistive path is obtained by depositing resistive ink on the ceramic body or by etching the ceramic body between the two conductive electrodes, forming a resistive path through deposition of a resistive material resulting from a local melting of the ceramic body.

The ink may be deposited by brush or it may be deposited after etching, defining a groove in which the ink will be deposited, which combines the two operations of etching and depositing resistive ink. The prior groove allows better control of the width and depth dimensions of the resistive path.

In all cases, instead of adding an external electrical resistor to the piezoelectric washer and attaching it to the conductive electrodes, the present invention deposits ink or deposits molten material from the ceramic body which establishes a resistive path on the outer contour of the ceramic body, which is straightforward and does not require any later attachment operation.

The resistive path forms part of the ceramic body and cannot be detached from the piezoelectric washer like an external electrical resistor. The volume of the piezoelectric washer is not increased and the electrical resistor thus obtained is protected.

Advantageously, when the resistive path is obtained by depositing resistive ink, either ink is deposited to form the resistive path directly or a local strip of ink is deposited, the local strip being etched to remove any deposit of ink which does not form part of the resistive path.

In this embodiment, a layer of ink is first deposited in the form of a strip larger than the desired resistive path. The resistive path is obtained by removing the portions of the strip which do not form part of the resistive path. Applying a strip allows ink to be deposited more easily and more regularly over a portion of the outer contour of the ceramic body of the piezoelectric washer than that obtained for a resistive path which is taken in isolation and necessarily narrower. In the latter case, it may be difficult to obtain the resistive path directly when depositing the ink, which makes it possible to avoid this preferred embodiment with the prior formation of a strip, the portions thereof which do not form part of the resistive path then being removed.

Advantageously, the etch is performed by laser beam. The etch may also be performed by machining. High precision over the length, width and thickness of the resistive path is required to obtain the desired resistivity for the resistive path. A laser technique allows this precision.

BRIEF DESCRIPTION OF THE DRAWINGS

Other features, objects and advantages of the present invention will become apparent on reading the following detailed description and on examining the appended drawings given by way of non-limiting examples, and in which:

FIG. 3 is a schematic representation of a side view of a piezoelectric washer with a resistive path made of ink according to a second embodiment of the present invention, the resistive path running with axial and tangential components across the edge of the ceramic body of the washer relative to an axis of symmetry of the washer;

FIG. 4 is a schematic representation of a side view of a piezoelectric washer with a resistive path made of ink according to a third embodiment of the present invention, the resistive path running tangentially across the edge of the ceramic body of the washer of cylindrical shape, the resistive path running axially across the edge of the ceramic body of the washer relative to an axis of symmetry of the washer;

FIG. 5 is a schematic representation of a side view of a piezoelectric washer with a resistive path made of ink on the basis of an inked strip according to an optional embodiment of the method for obtaining a resistive path on a piezoelectric washer according to the present invention, the inked strip being partially removed by etching to leave only the resistive path.

DESCRIPTION OF THE PREFERRED EMBODIMENTS

Figure 1:
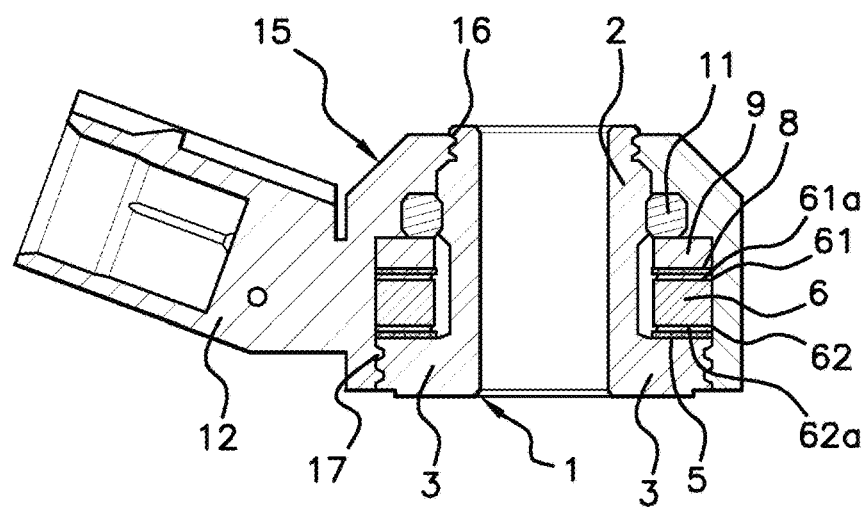
FIG. 1 is a schematic representation of a sectional view of an accelerometer sensor which can be fitted with a piezoelectric washer according to the present invention.

The accelerometer sensor comprises a cylindrical metal base 1 that is intended to rest on a supporting part, in particular a casing of an internal combustion engine, to which casing the accelerometer sensor is attached, for example by means of a socket head bolt that passes through the base 1 via a longitudinal void in an axial barrel 2 projecting from an annular shoulder 3.

The accelerometer sensor further comprises a plurality of washers around the barrel 2 and stacked on the shoulder 3. There are thus, starting from this shoulder and stacked in this order: an insulating washer 5 made of electrically insulating material, a metal contact ring 62a, a washer 6 made of a piezoelectric material and its electrodes 61, 62 which are each attached to one of the end faces of the washer 6, spaced axially apart. The piezoelectric washer 6 advantageously takes the shape of a cylinder, the axis of the cylinder being coincident with a longitudinal center axis of the void of the barrel 2.

Next come a second contact ring 61a, a second insulating washer 8 and a larger metal washer 9 constituting a seismic mass and a metal nut 11 screwed onto a thread formed on the barrel 2, the nut 11 tightening the set of washers listed above against the shoulder 3 of the base 1.

At least one of the insulating washers 5, 8 may be replaced by a layer of an electrically insulating adhesive product. As an illustrative and non-limiting example, this product may consist of an acrylic adhesive or an adhesive based on silicones or based on epoxy resin.

A coating 15 of an insulating plastic material is overmolded around the base 1 up to a free end of the barrel 2, ensuring the protection of the sensor. To this end, the outer walls of the barrel 2 and of the shoulder 3 feature annular grooves 16 and 17, respectively, the grooves 16 of the barrel 2 being in a free end portion of the barrel 2.

During overmolding, the plastic material used passes between the stack of the plurality of washers and the barrel 2. The plastic material also enters the annular grooves 17 of the shoulder 3 and the annular grooves 16 of the barrel 2. The grooves ensure that the coating 15 attaches to the sensor and is sealtight.

The various parts of the sensor—piezoelectric washer 6, electrodes 61, 62, seismic mass 9—are then firmly held between the coating 15 and the shoulder 3 of the base 1, this coating thus constituting a retaining means supplementing the action of the layers of adhesive products, these ensuring the cohesion of the sensor alone until the coating 15 has been formed.

The coating 15 also forms a protective socket 12 for two pins for connecting the contact rings 61a and 62a to an apparatus for processing the signal delivered by the sensor.

On the other hand, according to the prior the art with an electrical resistor associated with the piezoelectric washer being located outside the piezoelectric washer 6 while being overmolded in the coating 15 along with the piezoelectric washer, when the accelerometer sensor experiences thermal variations, the attachment lugs of the resistor are subjected to shear stresses due to the differences in thermal expansion between the overmolding material and the metal attachment lugs, which can lead to the resistor lugs breaking at the bends.

Referring more particularly to FIGS. 2 to 5 while referring to FIG. 1 for the references missing from FIGS. 2 to 5, the present invention relates to a piezoelectric washer 6 for an accelerometer sensor having a ceramic body. The piezoelectric washer 6 has a conductive electrode 61, 62 on each of two opposite faces which are separated by the thickness of the piezoelectric washer 6 forming its edge 6a.

To establish an electrical resistance of a predetermined value between the two conductive electrodes 61, 62, which is advantageously in the form of a layer of silver, according to the invention, the ceramic body of the piezoelectric washer has, on its outer contour, a resistive path 4 connecting the conductive electrodes 61, 62 to one other with a length and cross section of the resistive path 4 predetermined according to the value of the resistance to be established between the two conductive electrodes 61, 62.

The resistive path 4 may also have an electrical resistance that varies with the temperature to which the sensor, and hence the piezoelectric washer 6, is exposed. This may be achieved for example by depositing a resistive ink, the resistance of which changes with temperature in the opposite direction to a possible variation in resistance of the base material of the piezoelectric washer 6, which is to substantively correct the measurement differences due to the variation in electrical resistance of the base material.

Advantageously, the resistive path 4 runs axially, tangentially or with tangential and axial components across the external contour of an edge 6a of the ceramic body, the length l and cross section s of the resistive path 4 being predetermined according to the resistance R to be established and the resistivity r of a material forming the resistive path 4 according to the following formula:

$$R = \frac{r \times l}{s}$$

There are several embodiments of the resistive path 4.

In FIG. 3, the resistive path 4 runs with axial and tangential components across an edge 6a of the ceramic body of the piezoelectric washer while being inclined at an angle of less than 90° relative to the first conductive electrode 61.

In a first preferred embodiment, the resistive path 4 may run mainly in one or more planes parallel to the conductive electrodes 61, 62 while being connected at each of its ends to a respective conductive electrode 61, 62. This is shown in FIG. 4.

In this FIG. 4, the resistive path 4 makes just over one complete turn around an edge 6a of the piezoelectric washer 6. A first complete loop is denoted by 7c and a second loop that extends the first loop 7c and makes only part of a turn is denoted by 7d. One end of the first loop 7c makes contact with a first, starting conductive electrode 61 while the end of the second loop 7d makes contact with a second, destination electrode 62. The loops 7c, 7d are spaced apart from each other between the conductive electrodes 61, 62 while being concentric.

In this embodiment, it is possible for the resistive path 4 to make only one incomplete loop, several complete loops, and for the loops to run with an axial component across the ceramic body of the piezoelectric washer 6.

Figure 2:
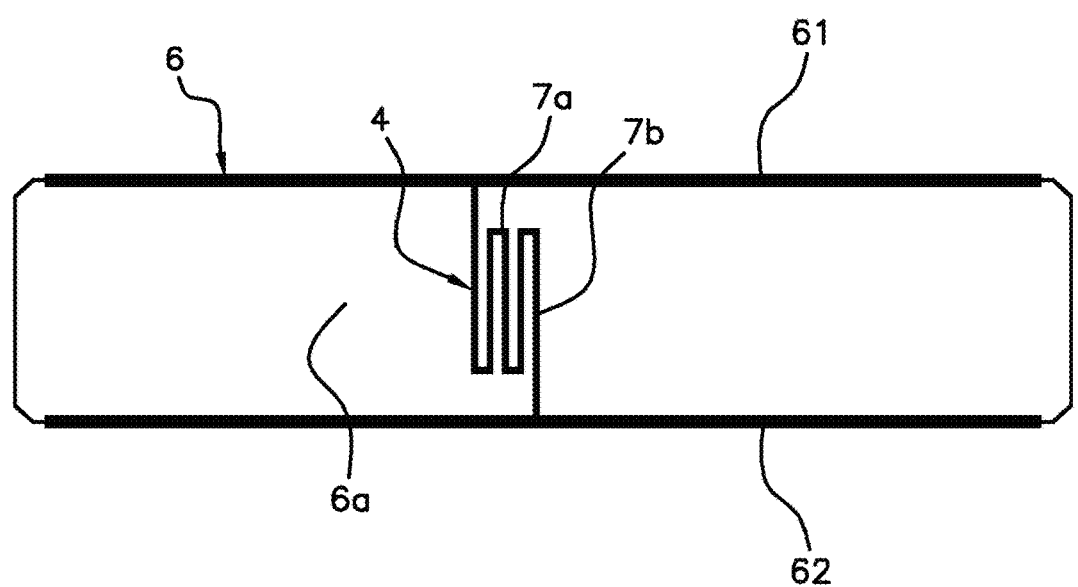
FIG. 2 is a schematic representation of a side view of a piezoelectric washer with a resistive path made of ink according to a first embodiment of the present invention, the resistive path running axially across the edge of the ceramic body of the washer relative to an axis of symmetry of the washer.

In a possible second preferred embodiment, the resistive path 4 may run mainly perpendicular to the conductive electrodes 61, 62 across an edge 6a of the piezoelectric washer 6 while being connected at each of its ends to a respective conductive electrode 61, 62. This is illustrated in FIGS. 2 and 5. The resistive path 4 is shorter in this case than in the first embodiment.

To lengthen the resistive path 4, the resistive path 4 may have at least one return loop 7a having a return branch toward a first, starting conductive electrode 61 which does not reach the starting conductive electrode 61 and a branch directed toward a second, destination conductive electrode 62. In the case of a single return loop 7a, the branch directed toward the second, destination conductive electrode 62 reaches the second, destination conductive electrode 62 and makes electrical contact with this second electrode.

This is not shown in FIGS. 2 and 5 because in these figures, the resistive path 4 may have at least one return loop 7a and a final loop 7b that extends said at least one return loop 7a, said final loop 7b having a return branch toward a first, starting conductive electrode 61 which does not reach the first, starting conductive electrode 61 and a final branch which reaches the second, destination conductive electrode 62.

In this second embodiment, there may be more than two return loops, although this is not shown in FIGS. 2 and 5. Likewise, the path of the return loops is not necessarily perpendicular to the conductive electrodes 61, 62 and may have a tangential component. It is possible for the resistive path 4 to form zigzags with branches not running in opposite directions but forming an acute angle between them.

In FIGS. 2 and 5, a length of a branch of at least one return loop 7a is greater than or equal to half of an edge 6a of the ceramic body. This allows the length of the resistive path 4 to be doubled at least.

Two embodiments of the resistive path 4 are possible, among other embodiments. In the first embodiment, the resistive path 4 may be produced by depositing resistive ink on the outer contour of the ceramic body by tracing a path. This is shown in FIGS. 2 to 5.

The ink may be an ink exhibiting a resistivity that varies with temperature so as to correct for a variation in the electrical resistance of the piezoelectric washer 6 due to a constituent material having the drawback of exhibiting an electrical resistance that is sensitive to temperature. The ink may contain carbon or a mixture containing carbon.

In the second embodiment, the resistive path 4 may be produced by etching the ceramic body or burning away a little thickness from the outer contour of the ceramic body, obtaining a path of resistive material resulting from a local melting of the ceramic body. This resistive path 4 may include carbon or other elements which allow a predetermined electrical resistance to be obtained. Routine tests may allow a person skilled in the art to define the resistivity of the path for a given material of the ceramic body of the resistive path 4 and to select an etch intensity that allows sufficient melting of the material to obtain the predetermined electrical resistance.

The invention also relates to an accelerometer sensor provided with such a piezoelectric washer 6. The accelerometer sensor may be a knock sensor or a cylinder pressure sensor for a combustion engine of a motor vehicle.

Lastly, the invention relates to a method for obtaining a resistive path 4 connecting the opposite conductive electrodes 61, 62 of a piezoelectric washer 6 as defined above with a length and cross section of the resistive path 4 predetermined according to the resistance to be established between the two conductive electrodes 61, 62 of the piezoelectric washer 6.

According to the invention, the resistive path 4 is obtained by depositing resistive ink on the ceramic body or by etching the ceramic body between the two conductive electrodes 61, 62, with, in the latter case, a resistive path 4 being formed through deposition of a resistive material resulting from a local melting of the ceramic body.

When the resistive path 4 is obtained by depositing resistive ink, ink may be deposited directly to form the resistive path 4. As an alternative, a local strip 13 of ink may be deposited, the local strip 13 then being etched to remove any ink deposit which does not form part of the resistive path 4, this being shown in FIG. 5.

In the case of depositing ink or melting material of the ceramic body, the etch may be performed by laser beam but may also be performed by machining or spark machining.

The invention claimed is:

1. A piezoelectric washer for an accelerometer sensor, the piezoelectric washer comprising
a ceramic body having an outer contour or edge; and
two conductive electrodes, each of the conductive electrodes being on one respective face of two opposite faces of the ceramic body, an electrical resistance to be established between the two conductive electrodes,
wherein the ceramic body has, on the edge thereof, a resistive path connecting the two conductive electrodes to one another with a length and cross-section of the resistive path predetermined according to the electrical resistance to be established between the two conductive electrodes.

2. The piezoelectric washer as claimed in claim 1, wherein the resistive path runs axially, tangentially or with tangential and axial components across the edge of the ceramic body, the length and the cross-section of the resistive path being predetermined according to the resistance to be established and a resistivity of a material forming the resistive path according to the following formula:

$$R = \frac{r \times l}{s}.$$

3. The piezoelectric washer as claimed in claim 2, wherein the resistive path runs mainly in one or more planes parallel to the two conductive electrodes while being connected at each of ends of the resistive path to a respective one of the conductive electrodes.

4. The piezoelectric washer as claimed in claim 2, wherein the resistive path runs mainly perpendicular to the two conductive electrodes across a thickness of the piezoelectric washer while being connected at each of ends of the resistive path to a respective one of the conductive electrodes.

5. The piezoelectric washer as claimed in claim 4, wherein the resistive path has at least one return loop having a return branch toward a starting conductive electrode of the two conductive electrodes which does not reach the starting conductive electrode and a branch directed toward a destination conductive electrode of the two conductive electrodes, the branch directed toward the destination conductive electrode reaching the destination conductive electrode when the at least one return loop is a single return loop.

6. The piezoelectric washer as claimed in claim 5, wherein the resistive path has at least one return loop and a final loop that extends said at least one return loop, said final loop having a return branch toward the starting conductive electrode which does not reach the starting conductive electrode and a final branch which reaches the destination conductive electrode.

7. The piezoelectric washer as claimed in claim 1, wherein the resistive path is resistive ink deposited on the outer contour of the ceramic body.

8. The piezoelectric washer as claimed in claim 1, wherein the resistive path is a path of resistive material resulting from a local melting of the ceramic body during etching or burning of the outer contour of the ceramic body.

9. An accelerometer sensor, comprising:
an electric circuit; and
the piezoelectric washer as claimed in claim 1.

10. A method for obtaining a resistive path connecting the opposite conductive electrodes of the piezoelectric washer as claimed in claim 1, the method comprising:
predetermining the length and the cross-section of the resistive path according to the resistance to be established between the two conductive electrodes of the piezoelectric washer; and
obtaining the resistive path by depositing resistive ink on the ceramic body or by etching the ceramic body between the two conductive electrodes, forming the resistive path through deposition of a resistive material resulting from a local melting of the ceramic body.

11. The method as claimed in claim 10, wherein, when the resistive path is obtained by depositing resistive ink, either ink is deposited to form the resistive path directly or a local strip of ink is deposited, the local strip being etched to remove any deposit of ink which does not form part of the resistive path.

12. The method as claimed in claim 11, wherein the local strip is etched by laser beam.

13. The piezoelectric washer as claimed in claim 2, wherein the resistive path is resistive ink deposited on the outer contour of the ceramic body.

14. The piezoelectric washer as claimed in claim 3, wherein the resistive path is resistive ink deposited on the outer contour of the ceramic body.

15. The piezoelectric washer as claimed in claim 4, wherein the resistive path is resistive ink deposited on the outer contour of the ceramic body.

16. The piezoelectric washer as claimed in claim 5, wherein the resistive path is resistive ink deposited on the outer contour of the ceramic body.

17. The piezoelectric washer as claimed in claim 6, wherein the resistive path is resistive ink deposited on the outer contour of the ceramic body.

18. The piezoelectric washer as claimed in claim 2, wherein the resistive path is a path of resistive material resulting from a local melting of the ceramic body during etching or burning of the outer contour of the ceramic body.

19. The piezoelectric washer as claimed in claim 3, wherein the resistive path is a path of resistive material resulting from a local melting of the ceramic body during etching or burning of the outer contour of the ceramic body.

20. The piezoelectric washer as claimed in claim 4, wherein the resistive path is a path of resistive material resulting from a local melting of the ceramic body during etching or burning of the outer contour of the ceramic body.

* * * * *